(12) United States Patent
Duda et al.

(10) Patent No.: US 9,413,142 B2
(45) Date of Patent: Aug. 9, 2016

(54) PANELBOARD INSULATIVE PLENUM

(71) Applicant: General Electric Company, Schenectady, NY (US)

(72) Inventors: Mariusz Duda, Windsor Locks, CT (US); William Maurer, Southington, CT (US); Dean Robarge, Southington, CT (US); Eric Rowland, Glastonbury, CT (US); Michael Wood, Southington, CT (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 305 days.

(21) Appl. No.: 13/711,878

(22) Filed: Dec. 12, 2012

(65) Prior Publication Data
US 2014/0160639 A1 Jun. 12, 2014

(51) Int. Cl.
H02B 1/56 (2006.01)
H05K 7/20 (2006.01)
H02B 1/04 (2006.01)
H02B 1/20 (2006.01)
H02B 1/06 (2006.01)
H02B 13/025 (2006.01)

(52) U.S. Cl.
CPC .. H02B 1/04 (2013.01); H02B 1/06 (2013.01); H02B 1/20 (2013.01); H02B 1/56 (2013.01); H05K 7/20 (2013.01); H02B 13/025 (2013.01)

(58) Field of Classification Search
None
See application file for complete search history.

(56) References Cited

U.S. PATENT DOCUMENTS

| | | | |
|---|---|---|---|
| 2,351,942 A | 6/1944 | Dyer et al. | |
| 2,717,339 A | 9/1955 | Brown | |
| 3,210,608 A | 10/1965 | Appleton | |
| 3,258,569 A | 6/1966 | Frink | |
| 3,842,381 A | 10/1974 | Bernatt et al. | |
| 4,019,005 A | 4/1977 | Michetti | |
| 4,945,450 A | 7/1990 | Sabatella et al. | |
| 4,965,544 A * | 10/1990 | Kelaita, Jr. | H01H 9/0264 174/138 F |
| 5,113,312 A * | 5/1992 | Pratt | H02B 1/14 361/611 |
| 5,150,091 A | 9/1992 | Hart et al. | |
| 5,241,289 A | 8/1993 | Markowski et al. | |
| 5,304,761 A * | 4/1994 | Rosen | H01H 9/0264 200/304 |
| 5,574,624 A | 11/1996 | Rennie et al. | |
| 5,710,402 A | 1/1998 | Karnbach et al. | |
| 6,215,654 B1 | 4/2001 | Wilkie, II et al. | |
| 6,410,844 B1 | 6/2002 | Bruner et al. | |
| 6,417,443 B1 | 7/2002 | Smith | |
| 7,813,110 B1 * | 10/2010 | Rezac | H02B 1/056 174/149 B |
| 7,843,682 B2 | 11/2010 | Leinen et al. | |
| 8,519,287 B2 | 8/2013 | Raabe et al. | |
| 2005/0012578 A1 | 1/2005 | Afshari et al. | |
| 2007/0097604 A1 | 5/2007 | Bruski et al. | |
| 2009/0185333 A1 | 7/2009 | Coomer et al. | |

* cited by examiner

*Primary Examiner* — Courtney Smith
(74) *Attorney, Agent, or Firm* — GE Global Patent Operation; Stephen G. Midgley

(57) ABSTRACT

An electrical switching apparatus for housing a pair of opposing circuit breakers includes a panelboard having a first longitudinal axis and configured to support the pair of opposing circuit breakers to define a gap therebetween, the gap having a second longitudinal axis extending generally parallel to the first longitudinal axis. An insulative barrier is arranged to define a plenum region having a third longitudinal axis, and is operatively disposed in the gap, wherein the third longitudinal axis extends generally parallel to said second longitudinal axis.

27 Claims, 11 Drawing Sheets

PANELBOARD INSULATIVE PLENUM

BACKGROUND OF THE INVENTION

The embodiments described herein relate generally to power equipment protection devices and, more particularly, to apparatus employing an insulated plenum for use in diffusing ionized exhaust gases and pressure away from a location of arc generation.

Conventional panelboards provide an electrical distribution apparatus for mounting a plurality of circuit breakers to control electrical distribution from a main to one or more branch circuits. Such panelboards typically comprise a wall-mounted enclosure supporting conductive bus bars and electrical switching apparatus (e.g., without limitation, switching devices and circuit interrupters such as circuit breakers, contactors, motor starters, motor controllers and other load controllers) electrically coupled to the bus bars.

Circuit breakers are often arranged in conventional panelboard assemblies in adjacent pairs and are connected in an end-opposing, "double-branch" arrangement, to bus bars carrying current of the same electrical phase. Circuit breakers typically have a molded plastic housing enclosing at least one pair of separable contacts. When the separable contacts are opened, under overload, short circuit or fault conditions, an arc is created which is accompanied by the generation of ionized gases. The ionized gas temperatures can reach or exceed 20,000° C., which can vaporize the conductors and adjacent equipment. Moreover, an arc flash can release significant energy in the form of heat, intense light, pressure waves, and/or sound waves, sufficient to damage the conductors and adjacent equipment.

Such ionized gases are conventionally discharged through exhaust vent openings arranged in the circuit breaker housing and, when discharged from one circuit breaker within the double-branch arrangement, could transfer to the other adjacent circuit breaker, or to the bus bar conductors, resulting in a phase-to-phase electrical fault. The ionized gases could also cause a phase-to-ground failure with the metallic panelboard enclosure within which the circuit breaker is mounted.

Known prior art panelboard assemblies employ barriers between the opposing poles of a pair of double-branch mounted, spaced-apart circuit breakers in a multi-phase power system to prevent a phase-to-phase electrical fault caused by ionized exhaust gases discharged from one circuit breaker phase from reaching or contacting other phase conductors in the power system.

Although some prior art panelboards have included barriers to protect the phase conductors from the discharged ionized gases, these barriers typically aim to prevent the flow of the exhaust gases past the barrier and do not segregate or direct the ionized exhaust gases into an insulated chamber or plenum. Additionally, other prior art barriers use more complex multiple piece barrier arrangements, which increase cost. There is a need therefore, for an improved simple, robust, and inexpensive, insulative barrier having minimal parts, installable in a panelboard, and capable of diffusing and effectively controlling discharged ionized gases.

Accordingly, there is room for improvement in circuit protective systems having an insulative plenum for electrical switching apparatus and panelboard assemblies.

BRIEF DESCRIPTION OF THE INVENTION

In one aspect, an electrical switching apparatus for housing a pair of opposing circuit breakers is disclosed. The apparatus includes a panelboard having a first longitudinal axis and is configured to support the pair of opposing circuit breakers to define a gap therebetween, the gap having a second longitudinal axis extending generally parallel to the first longitudinal axis. An insulative barrier is arranged to define a plenum region having a third longitudinal axis, and is operatively disposed in the gap, wherein the third longitudinal axis extends generally parallel to said second longitudinal axis.

In another aspect, an electrical protection system is disclosed. The protection system includes an enclosure for housing a pair of circuit breakers, the enclosure having a first end and an opposing second end, the first and second ends having a first longitudinal axis therebetween. The enclosure is configured to operatively support the pair of circuit breakers to define a gap therebetween, the gap having a second longitudinal axis extending generally parallel to the first longitudinal axis. An insulative barrier is arrangeable to define a plenum region having a third longitudinal axis, the insulative barrier configured to be operatively disposed in the gap, wherein the third longitudinal axis extends generally parallel to said first longitudinal axis. The enclosure further includes a plurality of conductors arranged therein, at least one of the plurality of conductors being operatively coupleable to at least one circuit breaker of the pair circuit breakers.

DETAILED DESCRIPTION OF THE INVENTION

Exemplary embodiments of circuit protection systems and apparatus are described herein. These embodiments enhance the quenching and controlling of gases, heat, and pressure that exhaust from a circuit breaker after an arc is generated. These embodiments quench and control the flow of exhaust gases, heat, and pressure out of circuit breaker contained within the circuit protection system. Quenching and controlling the exhaust gases protects the circuit protection system and any other electrical equipment that is positioned within the equipment enclosure from the flow of exhaust gases, heat, and pressure.

While various embodiments are described herein with reference to an electrical panelboard assembly having one or more pairs of opposing conventional three-pole circuit breakers, other contemplated embodiments are not so limited and may also embody other electrical power devices and systems such as, for example, load centers or similar power distribution apparatus having electrical switching devices such as, for example, single or multi-pole circuit switching devices, such as contactors, motor starters, motor controllers, and other load controllers.

As employed herein, the term "ionized" means completely or partially converted into ions and being electrically conductive such as, for example, ionized gases generated in response to an electrical fault.

As employed herein, the term "double-branch" refers to a configuration of electrical switching apparatus within a panelboard, such as a pair of spaced-apart circuit breakers each having a plurality of poles, with each of the poles of one of the spaced-apart circuit breakers having a corresponding opposing one of the poles on the other one of the spaced-apart circuit breakers, such that each pair of corresponding opposing poles is electrically connected to an elongated bus bar carrying current of the same electrical phase.

Figure 1:
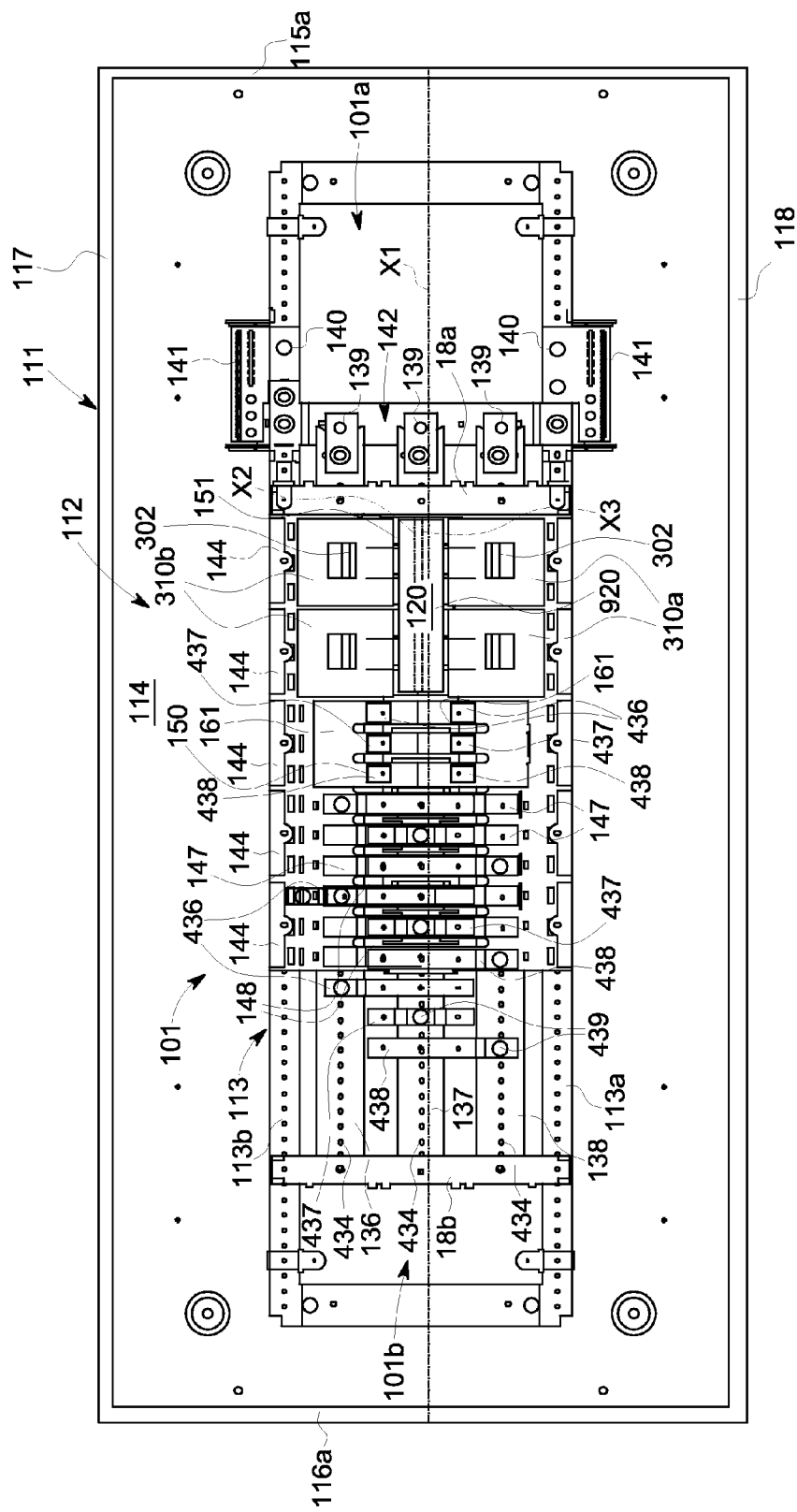
FIG. 1 is a front view of an exemplary circuit protection system according to an embodiment, with the cover omitted for clarity.
Figure 2:
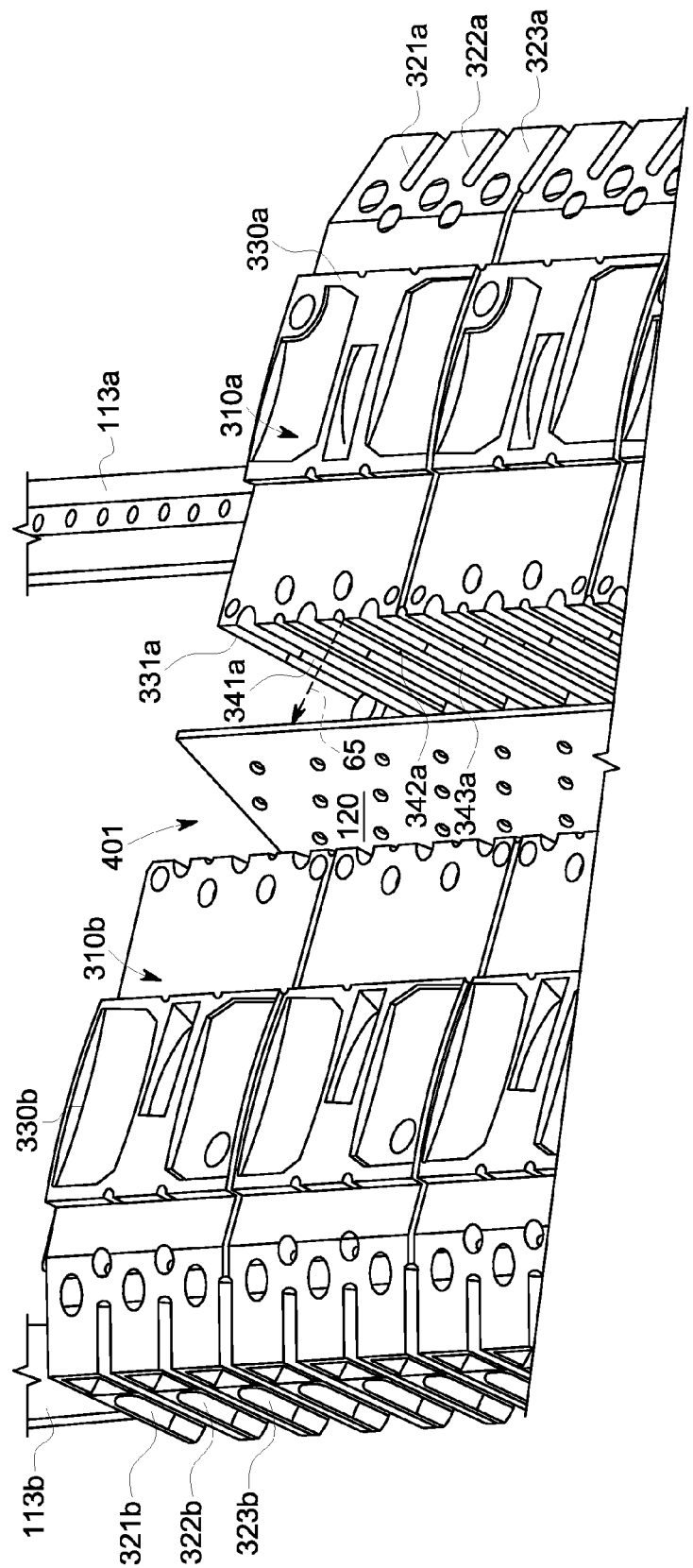
FIG. 2 is a perspective view of a portion of a circuit protection system according to an embodiment.
Figure 3:
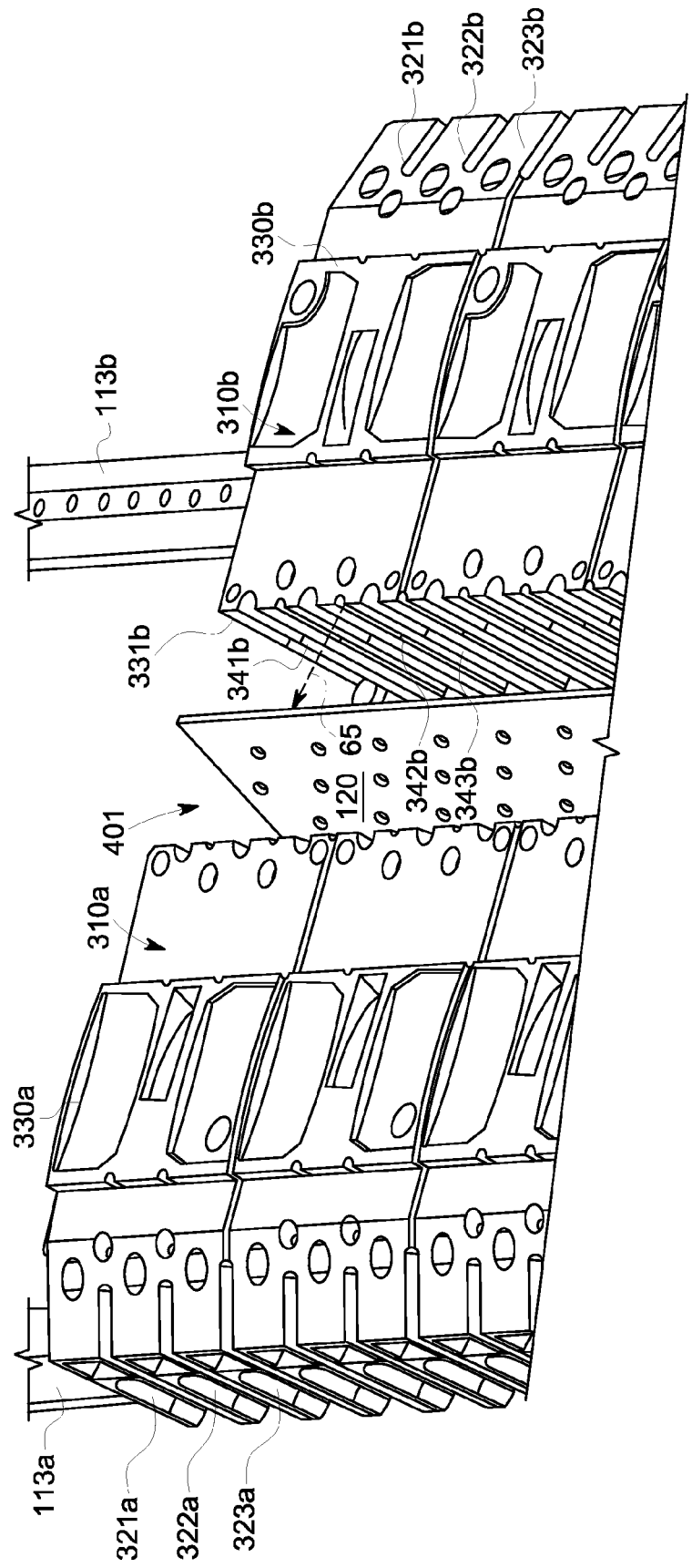
FIG. 3 is a perspective view of a portion of a circuit protection system according to an alternative embodiment.

FIG. 1 illustrates an insulative barrier 120 for use with an distribution device such as an electrical panelboard assembly 101. FIG. 1 depicts an embodiment having two pairs of circuit breakers, installed in the panelboard 101, with various redundant parts of the panelboard assembly 101 omitted for clarity.

In an embodiment, the panelboard assembly 101 includes a support frame 113, main or phase bus conductors 136, 137, 138 and a plurality of corresponding branch strap conductors 436, 437, or 438, and one or more circuit breaker mounting bases 144. In various embodiments, the panelboard assembly 101 also includes a cabinet or enclosure 111 defining an enclosure interior portion 112 therein. In an embodiment, the panelboard assembly 101 includes a first end 101a and a second opposing end 101b, defining a first longitudinal axis X1 extending therebetween.

In an embodiment, the support frame 113 includes a pair of elongated spaced apart side rails 113a and a pair of spaced apart end rails 113b rigidly coupled to the side rails 113a. In an embodiment, the support frame 113 is secured in engagement with a back wall 114 of the enclosure 111.

In an embodiment, the enclosure 111 includes a first end 115 and an opposing second end 116. In various embodiments, the enclosure 111 includes the back wall 114 and two opposing end walls 115a, 116a disposed at the enclosure 111 first end 115 and second end 116, respectively, and arranged generally orthogonal to the back wall 114. Enclosure 111 may also include two opposing spaced apart side walls 117, 118 extending between end walls 115a, 116a and arranged generally orthogonal to the back wall 114. Enclosure 111 may further include a panelboard cover 119 disposed spaced from and generally parallel to the back wall 114. In some embodiments, the cover may additionally comprise a deadfront portion, 119a (shown in FIG. 5) arranged to operatively prevent indavertant access to electrically live conductors within the enclosure 111. In other embodiments, a removable or openable non-deadfront portion 119b (FIG. 5) of the panelboard cover 119 is provided to allow user access to other interior parts. Respective openings in the deadfront 119a are arranged to allow the circuit breaker operating handles 302 to extend therethrough. In some embodiments, an openable door (not shown) is arranged to cover the handles of respective circuit breakers in a first closed position, and to provide access thereto in a second open position.

In an embodiment, the main or phase bus conductors 136, 137, 138 are arranged as plurality of spaced apart, substantially parallel, elongate, generally flat bus bars. For example, first, second and third elongated bus bars 136, 137, 138, are disposed in the enclosure interior portion 112, coupled to, and electrically isolated from, the support frame 113. Each phase conductor 136, 137, 138 is coupled to a respective lug 139 or other suitable connector for receiving incoming power, such as from an electrical cable.

At least one respective branch strap conductor 436, 437, or 438 is operatively coupled to corresponding main bus or phase conductor 136, 137, 138. In an embodiment, the main bus 136, 137, 138 and branch strap conductors 436, 437, 438 may be rigidly coupled via a fastener 439 such as a bolt or rivet. For example, each main bus or phase conductor 136, 137, 138 may be provided with a plurality of longitudinally spaced apertures 434 defined therethrough, and sized to receive the fastener 439. Likewise, the branch strap conductors 436, 437, and 438 may also include an aperture defined therethrough and sized to receive the fastener 439.

A neutral assembly 140 may also be included as part of the panelboard assembly 101. In an embodiment, the neutral assembly 140 includes spaced apart parallel conductive bars 141 having a plurality of suitable lugs and screws. The neutral assembly 140 is secured to support frame 113. In an embodiment, the neutral assembly is secured to the support frame 113 along opposite longitudinal margins thereof, and a conductive member 142 extends between and electrically couples portions of the neutral assembly 140.

In various embodiments, the panelboard assembly 101 also includes one or more insulative braces 18, such as top brace 18a and bottom brace 18b to prevent movement of the phase bus bars 136, 137, 138 during a fault condition. In an embodiment, the insulative braces 18 are formed of an insulative thermoplastic material such as Noryl, and rigidly secured to and bridge phase bus bars 136, 137, 138. The braces 18 may also be rigidly secured to the side rails 113a, 113b.

In an embodiment, one or more circuit breaker mounting bases 144 are configured to align, support, and position a corresponding pair of circuit breakers 310A, 310B to be operatively coupled to the phase bus conductors 136, 137, 138. The mounting base 144 may be formed of an insulative thermoplastic material, such as Noryl, and rigidly secured to and bridge the side rails 113a.

In an embodiment, the circuit breaker mounting base 144 includes a plurality of upstanding, elongated, parallel divider walls 149 integrally formed therewith. The divider walls 149 define branch strap compartments 147 spaced along the longitudinal axis X1 of the panelboard assembly 101. In an embodiment, a respective one of the branch strap conductors 436, 437, or 438 is disposed in each branch strap compartment 147 and arranged to be electrically coupled to a respective pole of at least one of the corresponding pair of circuit breakers 310A, 310B. In an embodiment, to enable the branch strap conductors 436, 437, or 438 to electrically couple to both a respective main bus conductor 136, 137, 138 and the corresponding circuit breaker 310A, 310B pole, each branch strap compartment 147 includes a respective mounting base branch strap aperture 148 defined therethrough, sized and disposed to enable a respective one of the respective branch strap connectors 436, 437, or 438 to be operatively disposed therethough. The divider walls 149 also separate adjacent circuit breaker 310A, 310B poles and thereby prevent inadvertent bridging between branch strap conductors 436, 437, or 438 of different electric potential.

In some embodiments, to insulate the portions of the branch strap conductors 436, 437, 438 disposed in the branch strap compartments 147 not intended to be operatively coupled to a circuit breaker 310A, 310B pole, a branch strap cover 161 is further operatively disposed between the branch strap conductors and at least one of the circuit breakers 310A, 310B. A respective branch strap cover aperture 150 is defined therethrough, and sized and disposed to enable a portion of a respective one of the respective branch strap connectors 436, 437, or 438 to be operatively disposed therethough and thereby readily coupleable to a respective circuit breaker 310A, 310B pole. In an embodiment, the branch strap cover 161 is formed from a sheet of insulative material such as Noryl.

In an embodiment, the circuit breaker mounting base 144 is disposed and arranged to operatively support at least a pair of conventional circuit breakers 310A, 310B in a spaced apart orientation in the enclosure interior portion 112. When operatively supported on the insulative base 144, the circuit breakers 310A, 310B are arranged to define a gap 401 therebetween, the gap 401 having a second longitudinal axis X2 extending generally parallel to the first longitudinal axis X1.

In the embodiments illustrated in FIGS. 1-4, the circuit breakers 310A, 310B are conventional three-pole circuit breakers, each having a plurality of poles, for example, first, second and third poles 321A, 322A, 323A of three-pole circuit breaker 310A, and first, second and third poles 321B, 322B, 323B of three-pole circuit breaker 310B. As shown, each one of the poles 321A, 322A, 323A of circuit breaker 310A has a corresponding opposing one of the poles 321B, 322B, 323B on the opposing circuit breaker 310B. The first circuit breaker 310A of the pair of circuit breakers 310A, 310B includes a housing 330A having a first end face 331A defining at least a first exhaust opening such as a vent 341A thereon. The second circuit breaker 310B of the pair of circuit breakers 310A, 310B includes a housing 330B having a second end face 331B defining at least a second exhaust opening such as a vent 341B thereon.

The vent openings 341A, 341B, are disposed and arranged to discharge ionized gases, depicted as arrow, 65 from within the circuit breakers 310A, 310B, such as in the event of an electrical fault. In the embodiment illustrated in FIG. X, the first end face 331A defines a plurality of exhaust openings such as vents 341A, 342A, 343A thereon for the corresponding poles 321A, 322A, 323A thereof; and the second end face 331B defines a plurality of exhaust openings such as vents 341B, 342B, 343B thereon for the corresponding poles 321B, 322B, 323B thereof. The vents 341A, 342A, 343A, 341B, 342B, 343B are disposed and arranged to discharge ionized gases 65 from within the circuit breakers 310A, 310B.

The insulative barrier 120 is sized and arranged to be operatively disposed in the gap 401 and to define a plenum region 130 therein, having a third longitudinal axis X3. In an embodiment, the third longitudinal axis X3 extends generally parallel to said first longitudinal axis X1. For example, in an embodiment, the longitudinal axis X3 of plenum region 130 is arranged to extend between the first end 101a and the opposing second end 101b of the panelboard assembly 101.

The insulative barrier 120 is disposed to be coupled in flow communication with the circuit breaker 310A 310B exhaust vents 341A, 342A, 343A, 341B, 342B, 343B. For example, the insulative barrier 120 may be disposed proximal to the first and second end faces 331A, 331B of the first and second circuit breakers 310A 310B.

Figure 5:
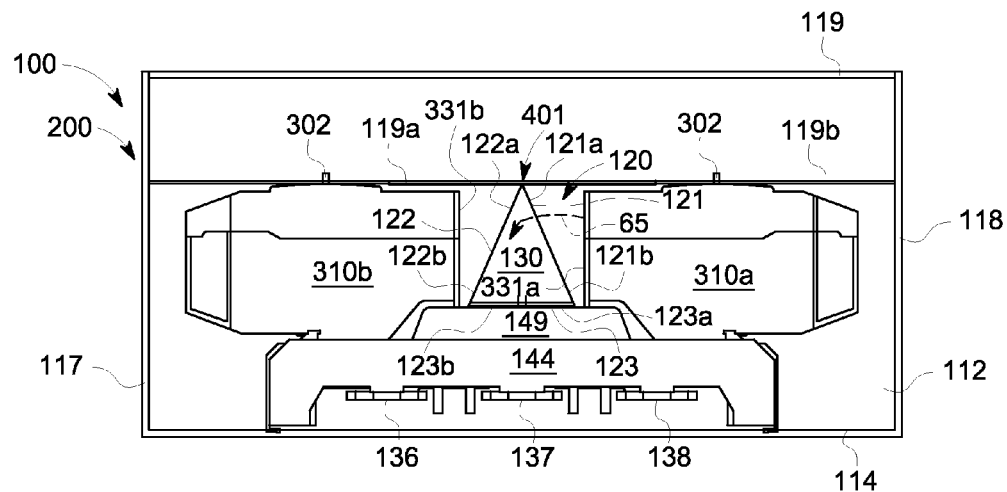
FIG. 5 is an end view of an exemplary circuit protection system according to an embodiment.
Figure 6:
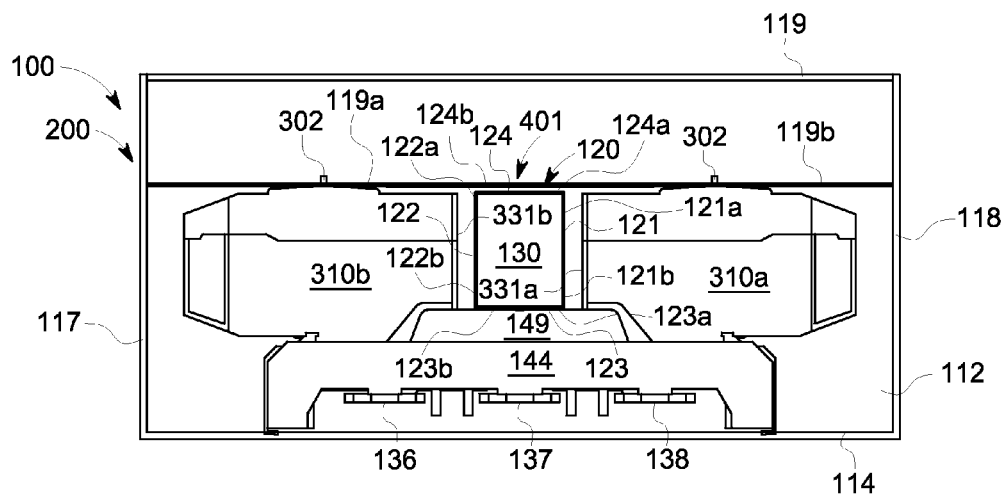
FIG. 6 is an end view of an exemplary circuit protection system according to an alternative embodiment.
Figure 11:
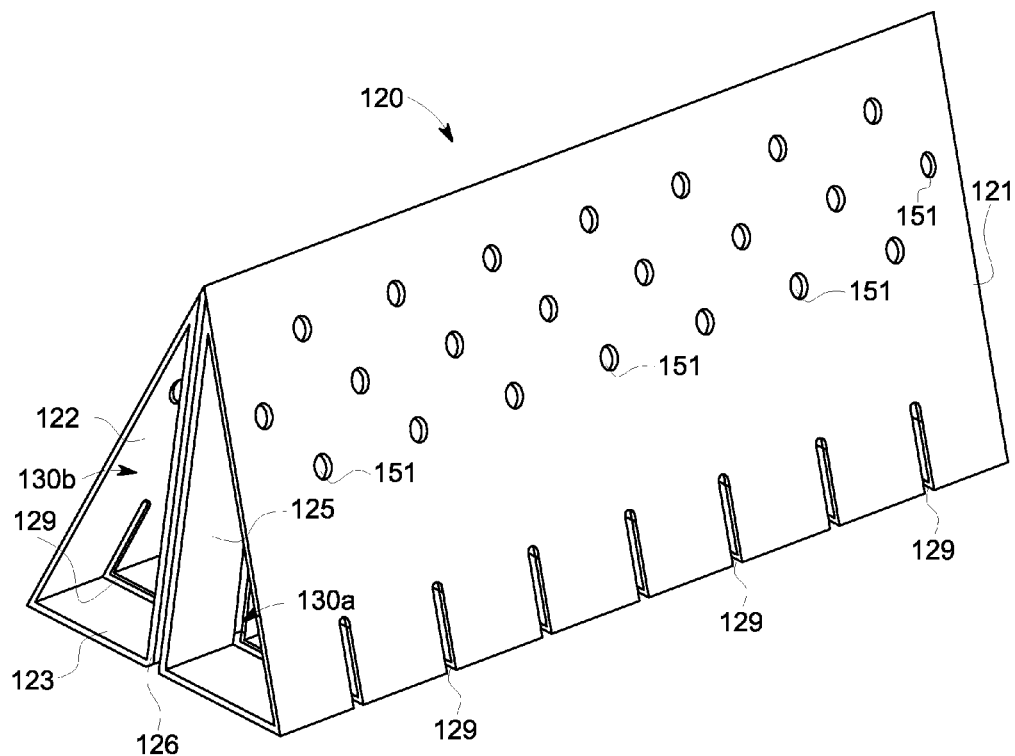
FIG. 11 illustrates an insulated barrier according to an embodiment.
Figure 12:
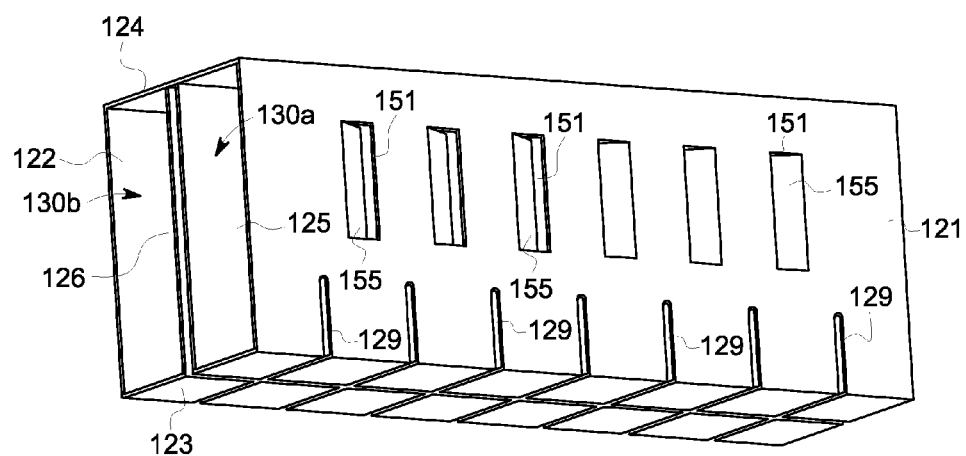
FIG. 12 illustrates an insulated barrier according to an alternative embodiment.
Figure 13:
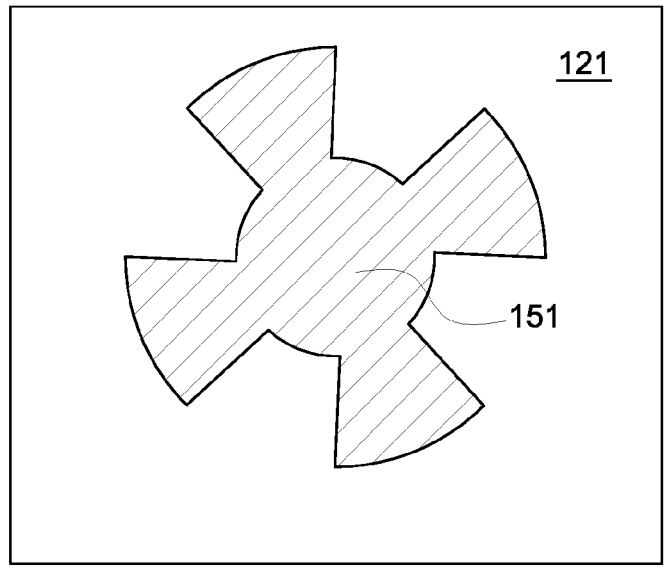
FIG. 13 is a detail view of an embodiment of insulative barrier aperture that may used with the embodiment of FIG. 11
Figure 14:
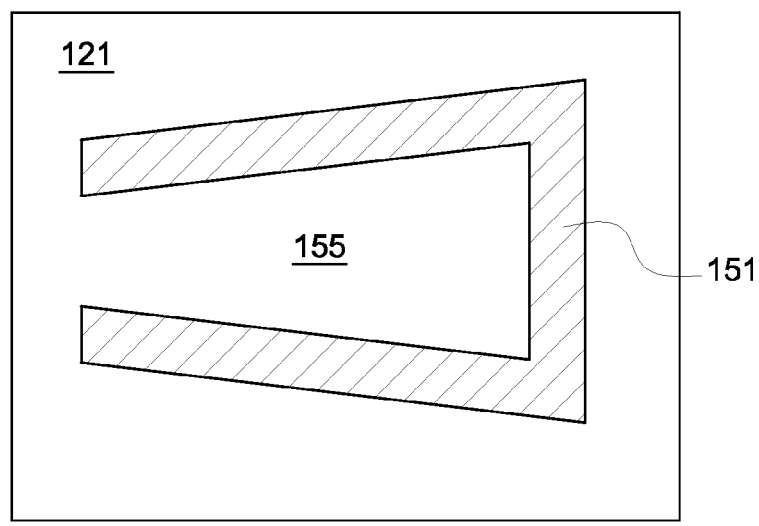
FIG. 14 is a detail view of an alternative embodiment of insulative barrier aperture that may be used with the embodiment of FIG. 11.

In an exemplary embodiment, as shown in FIGS. 5 and 11, the insulative barrier 120 may be formed having a generally triangular cross-section with the first, second and third outer wall portions 121, 122, 123 each being arranged as a respective leg of the triangle and defining the plenum region 130 therebetween. In still other embodiments, as shown in FIGS. 6 and 12, the insulative barrier 120 may be formed to define the plenum region 130 having a generally rectangular cross section, with the first, second, third, and a fourth outer wall portions 121, 122, 123, 124 each being arranged as a respective leg of the rectangle.

In other embodiments, insulative barrier 120 may be formed having any number of cross sectional arrangements and having any number of outer wall portions defining the plenum region 130 therebetween, and that enable the insulative barrier 120 to function as described herein.

Figure 4:
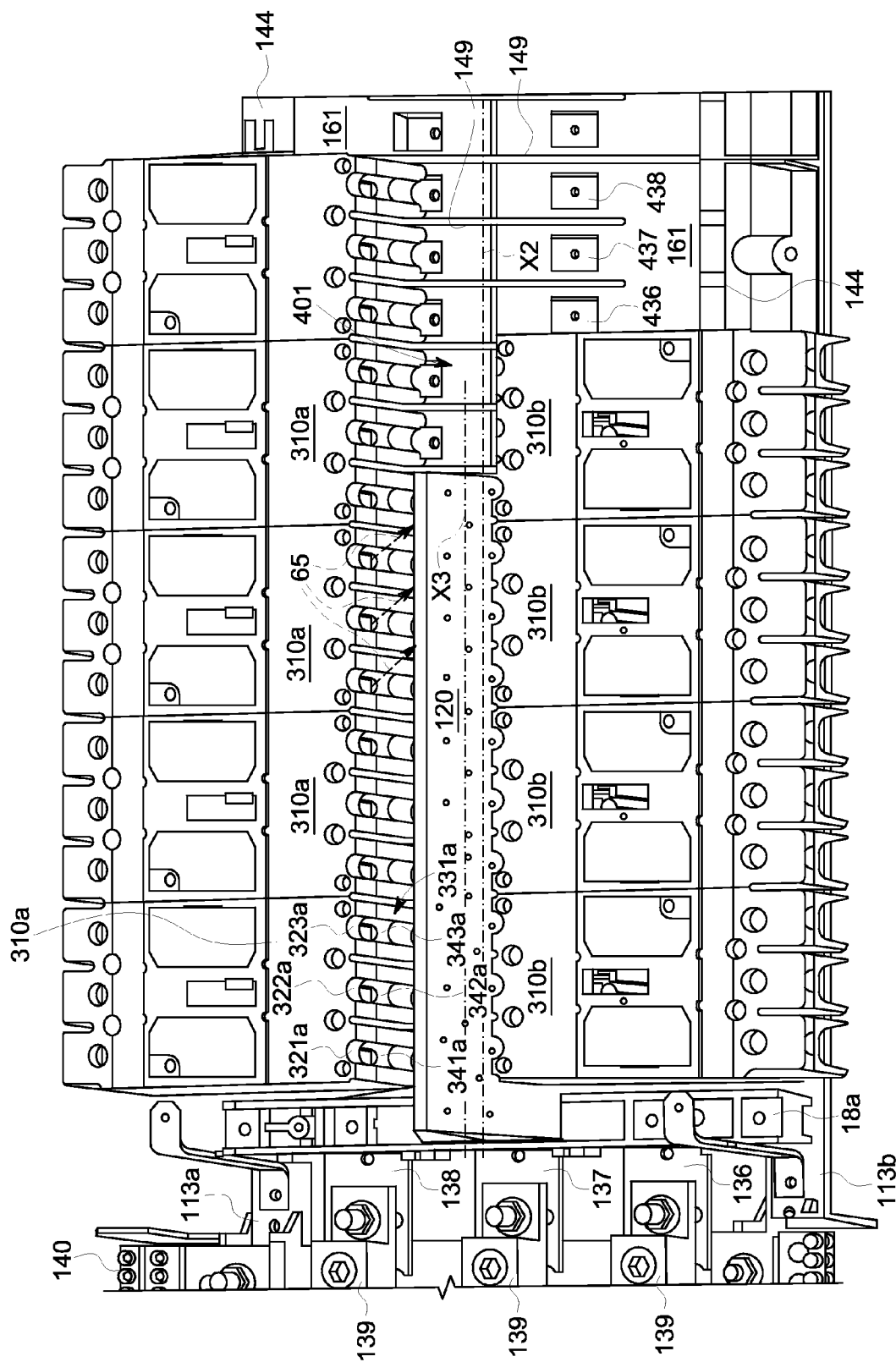
FIG. 4 is an perspective view of a portion of an exemplary circuit protection system according to an embodiment.

In an exemplary embodiment, and as shown in FIGS. 4, 5 and 11, insulative barrier 120 is fabricated using a suitable electrically insulative material arranged to form the first outer wall portion 121 having a first edge 121a and an opposing second edge 121b; and the second outer wall portion 122 having a first edge 122a and an opposing second edge 122b. The first outer wall portion 121 is configured to be operatively disposed proximate to and generally opposing said first circuit breaker end face 331A and to be coupled in flow communication with the circuit breaker 310A exhaust vents 341A, 342A, 343A. The second outer wall portion 122 is configured to be operatively disposed proximate to and generally opposing said second circuit breaker end face 331B and to be coupled in flow communication with the circuit breaker 310B exhaust vents 341B, 342B, 343B.

In an embodiment as shown in FIG. 5, the first edge 121a of first wall portion 121 is coupled to the first edge 122a of second outer wall portion 122. In other embodiments, a shown in FIG. 6, the fourth outer wall portion 124 is disposed to extend between the first outer wall portion 121 and the second outer wall portion 122 and comprises a first edge 124a and a second opposing edge 124b. In such an embodiment, the fourth outer wall portion first edge 124a may be coupled to the first outer wall portion first edge 121a, and the fourth outer wall portion second edge 124b may be coupled to the second outer wall portion first edge 122a.

Additionally, and as shown in FIGS. 4 and 5, insulative barrier 120 is fabricated to form the third outer wall portion 123 having a first edge 123a and an opposing second edge 123b. The third outer wall portion 123 is disposed to extend between the first outer wall portion 121 and the second outer wall portion 122. In an embodiment, the third outer wall portion 123 is further disposed between the plenum portion 130 and the branch strap connectors 436, 437, or 438. In an embodiment, the third outer wall portion first edge 123a is coupled to the first outer wall portion second edge 121b; and the third outer wall portion second edge 123b is coupled to the second outer wall portion second edge 122b.

Figure 7:
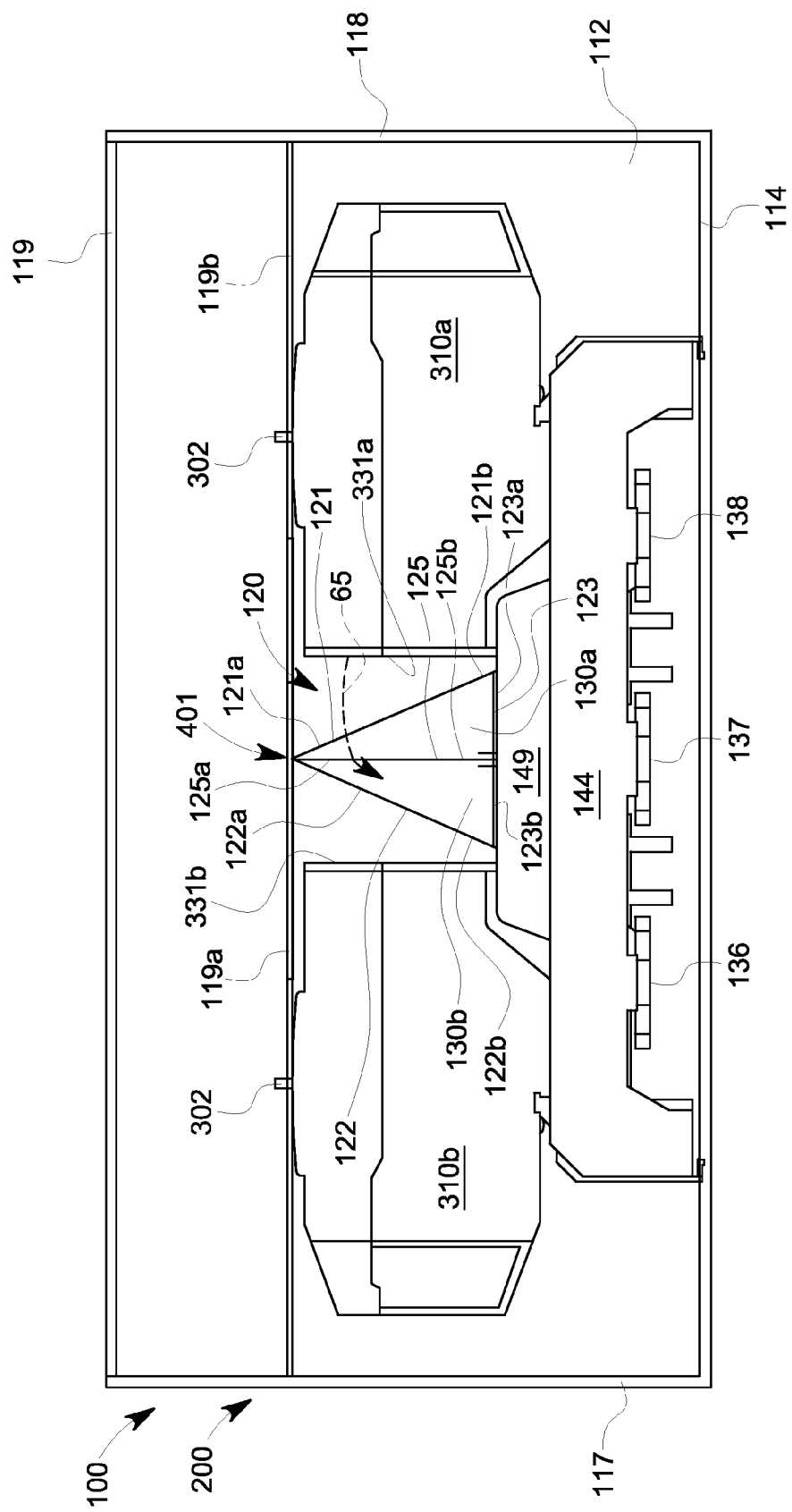
FIG. 7 is an end view of an exemplary circuit protection system according to an alternative embodiment.

In an embodiment, as illustrated in FIGS. 7 and 11, an inner wall portion 125 having a first edge 125a, and an opposing second edge 125b is fixedly coupled to, and arranged to extend between, the third outer wall portion 123 and the first and second outer wall portion first edges 121a, 122a to thereby divide the plenum region 130 into a first plenum portion 130a, and a second plenum portion 130b (FIG. 7). In an exemplary embodiment, the inner wall portion second edge 125b is fixedly coupled to the third outer wall portion 123, such that the first inner wall portion is arranged substantially orthogonal to the third outer wall portion 123. In another exemplary embodiment, the inner wall portion first edge 125a is fixedly coupled to at least one of the first and second outer walls first edge 121a, 122a; and the inner wall portion second edge 125b is coupled to the third outer wall portion 123. In another embodiment, as illustrated in FIG. 12, the inner wall portion 125 is fixedly coupled to, and arranged to extend between, the third outer wall portion 123 and the fourth outer wall portion 124.

In an embodiment, the inner wall portion 125 comprises a first inner wall portion 125 having a first edge 125a and an opposing second edge 125b; and a second inner wall portion 126 having a first edge 126a and an opposing second edge 126b. In such an embodiment, the first inner wall portion 125 may be arranged generally parallel to the second inner wall portion 126.

In an embodiment, the first and second inner wall portions 125, 126 are fixedly coupled to, and arranged to extend between, the third outer wall portion 123 and the first and second outer wall portion first edges 121a, 122a to thereby divide the plenum region 130 into the first plenum portion 130a, and a second plenum portion 130b. In an exemplary embodiment, the first and second inner wall portion second edges 125b, 126b are fixedly coupled to the third outer wall portion 123, such that the first and second inner wall portions 125, 126 are arranged substantially orthogonal to the third outer wall portion 123. In another exemplary embodiment, the first and second inner wall portion first edges 125a, 12a are fixedly coupled to at least one of the first and second outer walls first edge 121a, 122a. In an embodiment, the first and second inner wall portion second edges 125b, 126b are coupled to the third outer wall portion 123. In yet another embodiment, the first and second inner wall portions 125, 126 are fixedly coupled to, and arranged to extend between, the third outer wall portion 123 and the fourth outer wall portion 124.

Referring to FIGS. 11-14, an in various embodiments, to allow entry of the ionzed gases 65 into the plenum region 130, the barrier 120 first and second outer walls 121, 122 are further configured to be permeable with respect to the ionized gases 65 when vented from the circuit breakers 310A, 310B. For example, in an embodiment, the barrier 120 first and second outer walls 121, 122 may comprise a plurality of plenum apertures 151 defined therethrough and in flow communication with the plenum portion 130. In some embodiments, at least some of the plenum apertures 151 may additionally cooperate with a moveable flap 155 disposed on the corresponding first or second outer wall 121, 122 proximal to the respective plenum aperture 155. In an embodiment, the moveable flaps 155 are hingedly mounted and configured to deflect inboard toward the plenum region 130 in response to heat and pressure from the ionized gases 65 when vented from the circuit breakers 310A, 310B, and to allow the ionized gases to enter the plenum region 130.

The insulative barrier 120 operatively deflects the ionized exhaust gases 65 gases away from both electrically energized and grounded conductive parts in the panelboard 101, while allowing ionized exhaust gases 65 to enter the plenum region 130. Once in the plenum region 130, the exhaust gases 65 circulate within the plenum region 130, and are directed along the third longitudinal axis X3, moving away from the high pressure and towards low pressure portions of the plenum region 130. Contact by ionized exhaust gases 65 with an energized or grounded conductor is thereby prevented.

Figure 8:
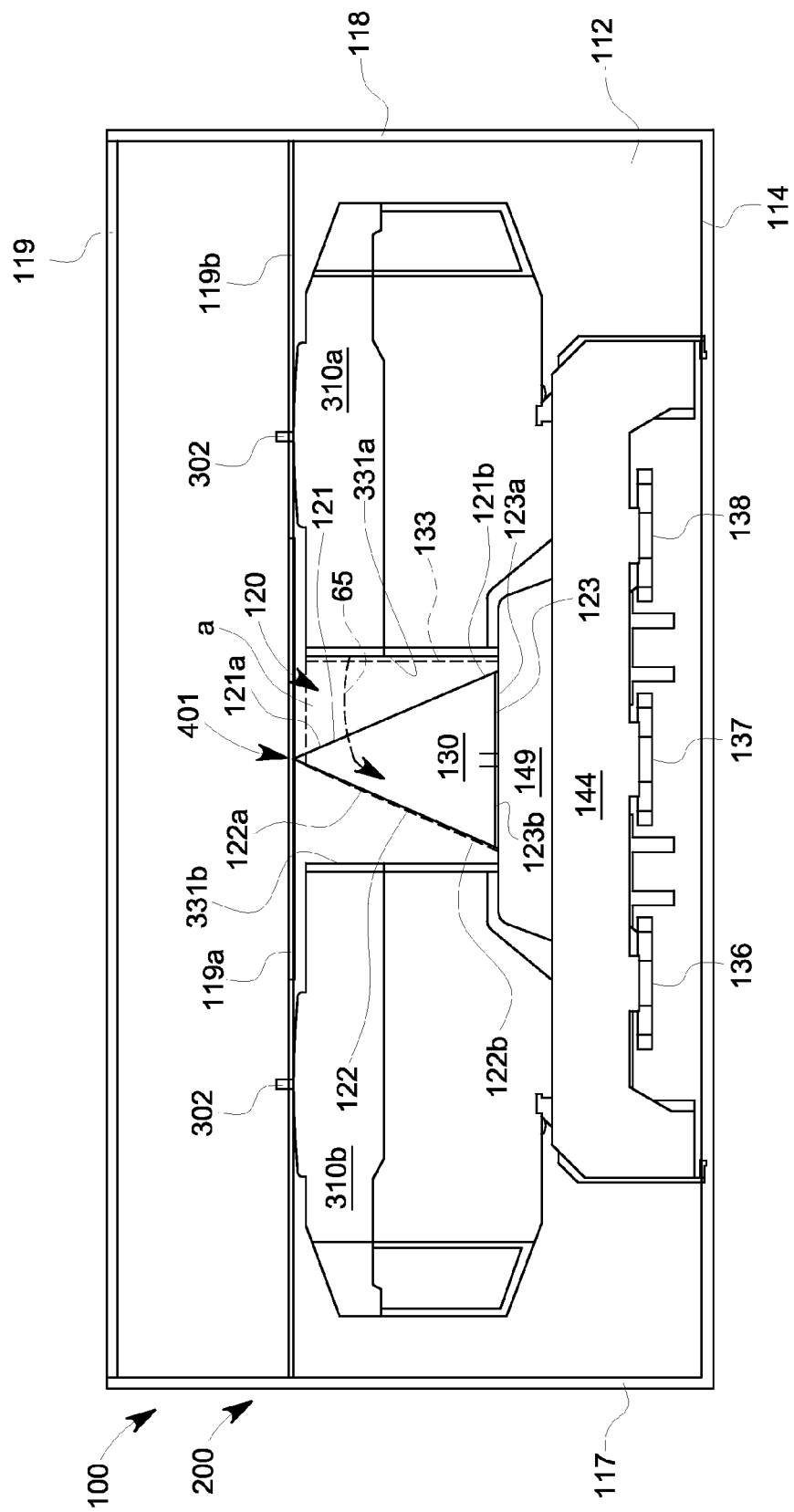
FIG. 8 is an end view of an exemplary circuit protection system according to an alternative embodiment.

Additionally, and as can be seen in FIG. 8, in an embodiment, the area available for one of the pair of circuit breakers 310A, 310B to exhaust ionized gases 65 into the gap 401, for example in the event of an electrical fault, as shown by dashed lines 133 defining an area A, is bounded by the insulated plenum region 130 and is greater than 50% of the total cross section area of gap 401.

In some embodiments, the insulative barrier 120 may be fabricated using a suitable electrically insulative material such as a flame retardant flexible polypropylene sheet. In other embodiments, the insulative barrier may be fabricated using a suitable ablative insulative material.

Figure 9:
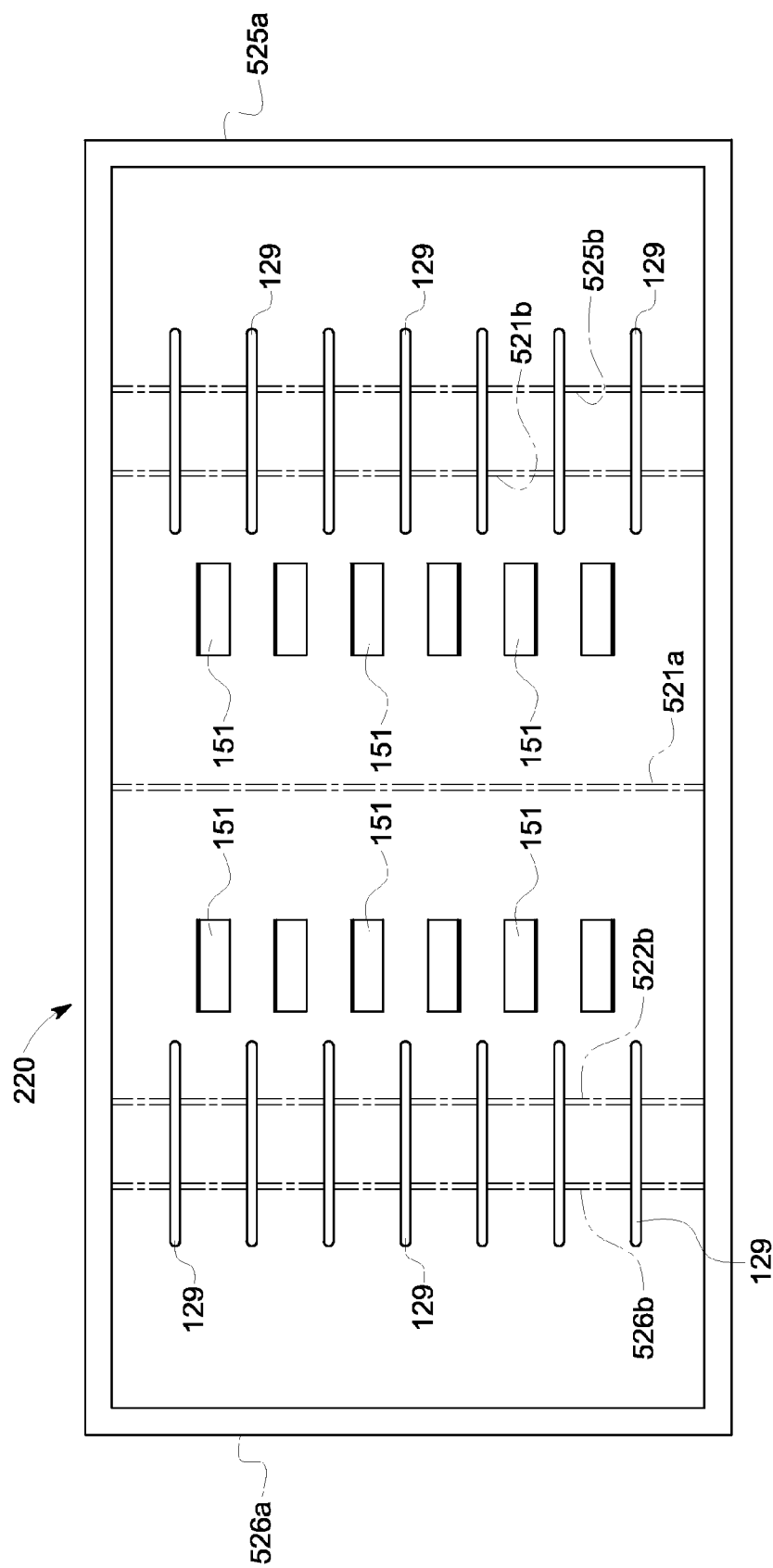
FIG. 9 illustrates an insulated sheet used to fabricate an insulated barrier according to an embodiment.
Figure 10:
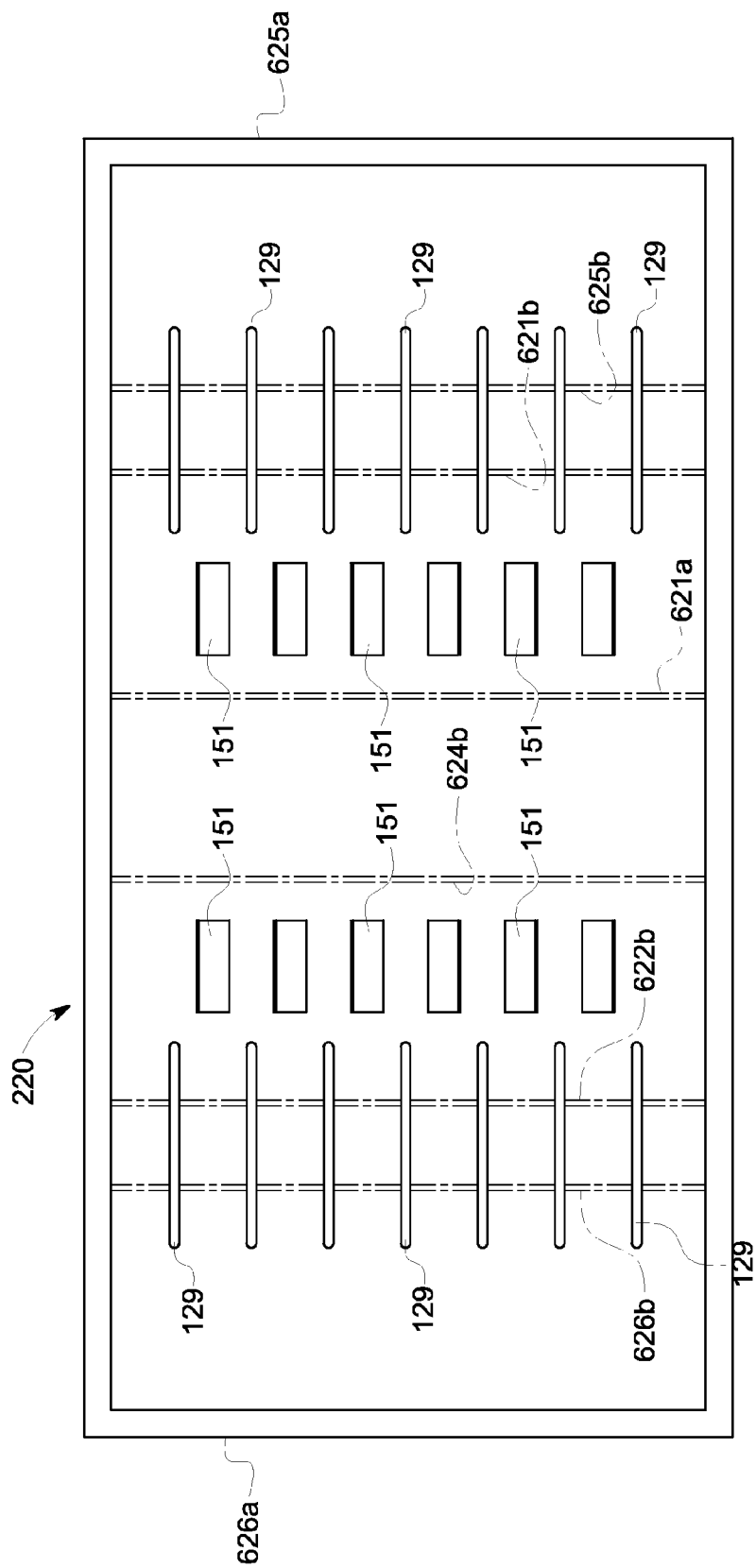
FIG. 10 illustrates an insulated sheet used to fabricate an insulated barrier according to an alternative embodiment.

In an embodiment, and as illustrated in FIGS. 9 and 10, the insulative barrier 120 may advantageously be formed from a unitary sheet 220 of suitable material. For example, such a unitary sheet 220 may be folded or otherwise bent to arrange the insulative barrier 120. To facilitate forming the barrier 120 from a unitary sheet 220, the sheet 220 may have creases or perforations formed thereon to guide a folding of the sheet 220 to form the barrier 120. As depicted in FIGS. 9 and 10, the dotted lines indicate crease or fold lines.

For example, as illustrated in FIG. 9, a barrier 120 having a generally triangular cross section and first and second inner wall portions 225, 226 may be formed from a unitary sheet 220 having a first edge 525a corresponding to the first inner wall portion first edge 225a; and a second opposing edge 526a corresponding to the second inner wall portion first edge 226a. A first crease 525b or fold formed thereon to define the first inner wall portion second edge 225b; a second crease 521b is formed thereon to define at least one of the first wall portion second edge 121b and third wall portion first edge 123a; a third crease 521a is formed thereon to define at least one of the first wall portion first edge 121a and second wall portion first edge 122a; a fourth crease 522b is formed thereon to define at least one of the second wall portion second edge 122b and third wall portion second edge 123b; and a fifth crease 526b is formed thereon to define the second inner wall portion second edge 226b. The unitary sheet 220 may be operatively folded and arranged using the creases formed thereon to guide each fold.

In another embodiment, as illustrated in FIG. 10, a barrier 120 having a generally rectangular cross section and first and second inner wall portions 225, 226 may be formed from a unitary sheet 220 having a first edge 625a corresponding to the first inner wall portion first edge 225a; and a second opposing edge 626a corresponding to the second inner wall portion first edge 226a. A first crease 625b or fold is formed thereon to define the first inner wall portion second edge 225b; a second crease 621b is formed thereon to define at least one of the first wall portion second edge 121b and third wall portion first edge 123a; a third crease 621a is formed thereon to define at least one of the first wall portion first edge 121a and fourth wall portion first edge 124a; a fourth crease 624b is formed thereon to define at least one of the fourth wall portion second edge 124b and second wall portion first edge 122a; a fifth crease 622b is formed thereon to define at least one of the second outer wall portion second edge 122b and third outer wall portion second edge 123b; and a sixth crease 626b is formed thereon to define second inner wall portion second edge 226b. The unitary sheet 220 may be operatively folded and arranged using the creases formed thereon to guide each fold.

In still other embodiments, a plurality of insulative sheets 220 may be used to form the insulative barrier 120, having any number of configurations that enable the insulative barrier 120 to function as described herein.

In some embodiments, as illustrated in FIGS. 9-12, retention features 129 such as slots are provided on insulative barrier 120. For example, the retention features 129 may be configured to cooperate with the divider walls 149 to prevent undesired movement of the insulative barrier 120. In other embodiments, other retention features 129 may be used to likewise hold insulated barrier 120 stationary. In yet other embodiments, as shown in FIG. 5, the panelboard deadfront may be operatively arranged to provide a retention force on insulative barrier 120 to further retain the insulative barrier 120 in the operative position in gap 410.

While various embodiments of the plenum apertures 155 are depicted herein as having a generally circular (FIG. 11) or rectangular (FIG. 11) shape, it is contemplated that other embodiments of the apertures 155 are not so limited, and may comprise irregular shapes (FIGS. 13 and 14) or any number of shapes, sizes, and patterns that allow the insulative barrier 120 to function as described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electrical switching apparatus comprising:
   a plurality of elongate conductive busbars arranged in parallel, one of said plurality of elongate conductive busbars defining a first longitudinal axis,
   a pair of circuit breakers, wherein a first circuit breaker of the pair of circuit breakers comprises a first end face having a first exhaust vent thereon, and the second circuit breaker of the pair of circuit breakers comprises a second end face having a second exhaust vent thereon, the pair of circuit breakers being coupled to the plurality busbars to define a gap therebetween said first and second end face, the gap having a second longitudinal axis parallel to the first longitudinal axis;
   an insulative barrier disposed in the gap, wherein said insulative barrier comprises a first outer wall disposed proximate and generally parallel to said first circuit breaker end face, and a second outer wall disposed proximate and generally parallel to said second circuit breaker end face the insulative barrier defining a plenum region having a third longitudinal axis generally parallel to said second longitudinal axis and generally parallel to said first and second end faces.

2. The apparatus of claim 1, wherein the insulative barrier comprises a plurality of creases formed thereon.

3. The apparatus of claim 1, wherein the insulative barrier further comprises retention features to retain the insulative barrier in an operative position in the gap.

4. The apparatus of claim 1, wherein the insulative barrier bounds a cross sectional area that is greater than 50% of the cross sectional area of the gap.

5. The apparatus of claim 1 wherein at least one of said first outer wall is disposed at an angle to said first circuit breaker end face and said second outer wall is disposed at an angle to said second circuit breaker end face.

6. The apparatus of any of claims 1 or 5, wherein said barrier further comprises a third interior wall disposed between said first outer wall and said second outer wall.

7. The apparatus of claim 6, wherein said third interior wall divides said plenum region into a first plenum portion and a second plenum portion.

8. The apparatus of claim 7, wherein said first plenum portion defines a fourth longitudinal axis, and said second plenum portion defines a fifth longitudinal axis, wherein said fourth longitudinal axis and said fifth longitudinal axis are disposed generally parallel to said third longitudinal axis.

9. The apparatus of any of claims 1 or 5, wherein said first outer wall defines a plurality of apertures therethrough, the plurality of apertures disposed in flow communication with the first exhaust vent opening of said first circuit breaker.

10. The apparatus of any of claims 1 or 5, wherein said second outer wall defines a plurality of apertures therethrough, the plurality of apertures disposed in flow communication with the second exhaust vent opening of said second circuit breaker.

11. The apparatus of claim 1, wherein said insulative barrier is formed of an ablative material.

12. An electrical protection system including to pair of circuit breakers, comprising:
    an enclosure for housing the pair of circuit breakers, said enclosure having a first end and an opposing second end, the first and second ends having a first longitudinal axis therebetween;
    wherein a first circuit breaker of the pair of circuit breakers comprises a first end face having a first exhaust vent thereon, and the second circuit breaker of the pair of circuit breakers comprises a second end face having a second exhaust vent thereon;
    the pair of circuit breakers arranged within said enclosure to define a gap therebetween said first and second end face, the gap having a second longitudinal axis generally parallel to the first longitudinal axis;
    an insulative barrier disposed in the gap to define a plenum region having a third longitudinal axis, wherein said insulative barrier comprises a first outer wall disposed proximate and generally parallel to said first circuit breaker end face, and a second outer wall disposed proximate and generally parallel to said second circuit breaker end face, wherein the third longitudinal axis extends generally parallel to said first longitudinal axis and generally parallel to said first and second end faces;
    the enclosure further having a plurality of conductors arranged therein, at least one of the plurality of conductors being coupled to at least one circuit breaker of the pair circuit breakers.

13. The electrical protection system of claim 12, wherein at least one of said first outer wall is disposed at an angle to said first circuit breaker end face and said second outer wall is disposed at an angle to said second circuit breaker end face.

14. The electrical protection system of any of claims 12 or 13, wherein said insulative barrier further comprises a third interior will disposed between said first outer wall and said second outer wall.

15. The electrical protection system of claim 12, wherein at least one of said first outer wall and said second outer wall defines a plurality of apertures in flow communication with the first exhaust vent opening of said first circuit breaker.

16. The apparatus of claim 1 further comprising an enclosure defining an interior portion, the conductive busbars and pair of circuit breakers disposed therein.

17. The apparatus of claim 14 wherein said third interior wall extends generally parallel to said third longitudinal axis.

18. An insulative barrier for a panelboard, the panelboard having a plurality of elongate busbars arranged in parallel, one of said plurality of elongate conductive busbars defining a first longitudinal axis installed therein defining a first longitudinal axis, a pair of circuit breakers wherein a first circuit breaker of the pair of circuit breakers comprises a first end face having a first exhaust vent thereon, and the second circuit breaker of the pair of circuit breakers comprises a second end face having a second exhaust vent thereon, the pair of circuit breakers coupled to the busbars to define a gap therebetween said first and second end face, the gap having a second longitudinal axis parallel to the first longitudinal axis, the an insulative barrier comprising:

plenum region having a third longitudinal axis, the insulative barrier disposed in the gap, wherein said insulative barrier comprises a first outer wall disposed proximate and generally parallel to said first circuit breaker end face, and a second outer wall disposed proximate and generally parallel to said second circuit breaker end face, wherein, the third longitudinal axis extends generally parallel to said second longitudinal axis and generally parallel to the first and second end faces.

19. The insulative barrier of claim 18 wherein the insulative barrier further comprises retention features to retain the insulative barrier in an operative position in the gap.

20. The insulative barrier of claim 18 wherein the insulative barrier bounds a cross sectional area that is greater than 50% of the cross sectional area of the gap.

21. The insulative barrier of claim 18, wherein at least one of said first outer wall is disposed at an angle to the first circuit breaker end face and said second outer wall is disposed at an angle to the second circuit breaker end face.

22. The insulative barrier of any of claims 18 or 21 wherein said barrier further comprises a third interior wall disposed between said first outer wall and said second outer wall.

23. The insulative barrier of claim 22, wherein said third interior wall divides said plenum region into a first plenum portion and a second plenum portion.

24. The insulative barrier of claim 23, wherein said first plenum portion defines a fourth longitudinal axis, and said second plenum portion defines a fifth longitudinal axis, wherein said fourth longitudinal axis and said fifth longitudinal axis are disposed generally parallel to said third longitudinal axis.

25. The insulative barrier of any of claims 18 or 21, wherein said first outer wall defines a plurality of apertures therethrough, each aperture oriented to be in flow communication with the first exhaust vent opening of the first circuit breaker.

26. The insulative barrier of any of claims 18 or 21, wherein said second outer wall defines a plurality of apertures therethrough, each aperture oriented to be in flow communication with the second exhaust vent opening of the second circuit breaker.

27. The insulative barrier of claim 18 wherein said insulative barrier is formed of an ablative material.

* * * * *